(12) United States Patent
Lee et al.

(10) Patent No.: US 10,490,605 B2
(45) Date of Patent: Nov. 26, 2019

(54) ORGANIC LIGHT EMITTING DISPLAY DEVICE

(71) Applicant: LG DISPLAY CO., LTD., Seoul (KR)

(72) Inventors: SeonMee Lee, Cheorwon-gun (KR); JungGeun Jo, Yangpyeong-gun (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/361,854

(22) Filed: Nov. 28, 2016

(65) Prior Publication Data

US 2017/0309688 A1 Oct. 26, 2017

(30) Foreign Application Priority Data

Apr. 20, 2016 (KR) .................. 10-2016-0048447

(51) Int. Cl.
*H01L 27/32* (2006.01)
*G09G 3/3225* (2016.01)
*G09G 3/20* (2006.01)

(52) U.S. Cl.
CPC ....... *H01L 27/3218* (2013.01); *G09G 3/2003* (2013.01); *G09G 3/3225* (2013.01); *H01L 27/3216* (2013.01); *H01L 27/3276* (2013.01); *G09G 2300/0452* (2013.01)

(58) Field of Classification Search
None
See application file for complete search history.

(56) References Cited

U.S. PATENT DOCUMENTS

| | | |
|---|---|---|
| 7,417,648 B2 | 8/2008 | Credelle |
| 7,443,093 B2 | 10/2008 | Jianpu et al. |
| 8,159,117 B2 | 4/2012 | Karaki et al. |
| 8,253,323 B2 | 8/2012 | Sung et al. |
| 8,330,352 B2 | 12/2012 | Sung et al. |
| 8,338,832 B2 | 12/2012 | Kim |
| 8,552,635 B2 | 10/2013 | Kim et al. |
| 8,716,929 B2 | 5/2014 | Yoo et al. |
| 8,754,913 B2 | 6/2014 | Hwang et al. |
| 8,994,015 B2 | 3/2015 | Pyon et al. |
| 9,041,625 B2 | 5/2015 | Hwang et al. |
| 9,307,584 B2 | 4/2016 | Ko |
| 9,318,537 B2 | 4/2016 | Sung et al. |
| 9,324,262 B2 | 4/2016 | Kim et al. |
| 2005/0110398 A1 | 5/2005 | Lee |
| 2011/0025723 A1 | 2/2011 | Kim |
| 2011/0260951 A1 | 10/2011 | Hwang et al. |
| 2013/0234917 A1 | 9/2013 | Lee |
| 2014/0043217 A1 | 2/2014 | Kim et al. |
| 2014/0071030 A1 | 3/2014 | Lee |
| 2015/0015466 A1 | 1/2015 | Feng |

(Continued)

FOREIGN PATENT DOCUMENTS

| | | |
|---|---|---|
| CN | 204885166 U | 12/2015 |
| EP | 3229223 A1 | 10/2017 |

(Continued)

*Primary Examiner* — Telly D Green
(74) *Attorney, Agent, or Firm* — Birch, Stewart, Kolasch & Birch, LLP

(57) ABSTRACT

Discussed is an organic light emitting display device including a first pixel, and a second pixel being adjacent to the first pixel, wherein each of the first pixel and the second pixel includes a plurality of subpixels, the first pixel and the second pixel share at least one subpixel of the plurality of subpixels.

31 Claims, 11 Drawing Sheets

(56) References Cited

U.S. PATENT DOCUMENTS

| | | | |
|---|---|---|---|
| 2015/0364526 A1 | 12/2015 | Peng et al. | |
| 2016/0027374 A1* | 1/2016 | Meng | G09G 3/32 345/694 |
| 2016/0057817 A9 | 2/2016 | Ko | |
| 2016/0063911 A1* | 3/2016 | Wu | G09G 3/3208 345/211 |
| 2016/0197123 A1 | 7/2016 | Sung et al. | |
| 2016/0197125 A1 | 7/2016 | Ko | |
| 2016/0217726 A1* | 7/2016 | Guo | G09G 3/2003 |
| 2016/0233273 A1* | 8/2016 | Ohyama | G02B 5/3083 |
| 2017/0294491 A1* | 10/2017 | Jo | G09G 3/2003 |
| 2017/0352710 A1* | 12/2017 | Hong | H01L 27/3218 |
| 2018/0088260 A1* | 3/2018 | Jin | G02F 1/136 |

FOREIGN PATENT DOCUMENTS

| | | |
|---|---|---|
| JP | 2008-209902 A | 9/2008 |
| JP | 2012-28170 A | 2/2012 |
| KR | 10-0560789 B1 | 3/2006 |
| KR | 10-0729077 B1 | 6/2007 |
| KR | 10-2008-0035774 A | 4/2008 |
| KR | 10-2009-0049515 A | 5/2009 |
| KR | 10-2010-0001598 A | 1/2010 |
| KR | 10-2011-0013691 A | 2/2011 |
| KR | 10-1066411 B1 | 9/2011 |
| KR | 10-2011-0117612 A | 10/2011 |
| KR | 10-2011-0117613 A | 10/2011 |
| KR | 10-2011-0129531 A | 12/2011 |
| KR | 10-2012-0020087 A | 3/2012 |
| KR | 10-2013-0007309 A | 1/2013 |
| KR | 10-2013-0025741 A | 3/2013 |
| KR | 10-2013-0101874 A | 9/2013 |
| KR | 10-2014-0020120 A | 2/2014 |
| KR | 10-2014-0111505 A | 9/2014 |
| KR | 10-2015-0007261 A | 1/2015 |
| KR | 10-2015-0007992 A | 1/2015 |
| KR | 10-2015-0107883 A | 9/2015 |
| KR | 10-2015-0122564 A | 11/2015 |
| KR | 10-2016-0018936 A | 2/2016 |
| KR | 10-2016-0019243 A | 2/2016 |
| KR | 10-2016-0029376 A | 3/2016 |
| WO | WO 02/091349 A1 | 11/2002 |
| WO | WO 03/056383 A1 | 7/2003 |

* cited by examiner

ORGANIC LIGHT EMITTING DISPLAY DEVICE

CROSS-REFERENCE TO RELATED APPLICATIONS

This application claims the priority benefit of Korean Patent Application No. 10-2016-0048447 filed on Apr. 20, 2016, which is hereby incorporated by reference as if fully set forth herein.

BACKGROUND OF THE INVENTION

Field of the Invention

The present disclosure relates to an organic light emitting display device, and more particularly, to an organic light emitting display device with an improved cognitive fill factor, minimized lattice defects, and minimized color fringe.

Description of the Related Art

Recently, as society advances to the information society, the field of display devices which visually express electrical information signals is rapidly advancing. Thus, various display devices with performance, such as thinness, lightness, and low power consumption have been developed.

As specific examples of the display devices as described above, there are a liquid crystal display (LCD) device, a plasma display panel (PDP) device, a field emission display (FED) device, and an organic light emitting display (OLED) device.

In particular, the organic light emitting display device attracts much attention as a self-light emitting element since the organic light emitting display device is fast in response time and has excellent light emitting efficiency, high brightness, and a wide viewing angle compared to the other display devices.

In addition, an organic light emitting diode, which is applied to the organic light emitting display device, is a next-generation light source that has self-luminance characteristics and is excellent compared to the liquid crystal in terms of a viewing angle, contrast, a response time, power consumption, and the like. In addition, the organic light emitting element has a surface light emitting structure, and thus may be easily used to implement a flexible display device.

The organic light emitting display device includes plurality of subpixels including red subpixels, green subpixels, and blue subpixels. The red subpixels, the green subpixels, and the blue subpixels emit red light, green light, and blue light, respectively, and a full-color image may be implemented by means of the plurality of subpixels.

Recently, in order to implement a high-resolution image of the organic light emitting display device, researches are being actively conducted on pixel structures such as aperture ratios of the subpixels or positions of the subpixels. In general, the subpixels in the organic light emitting display device has a symmetrical structure in which the subpixels are spaced apart from each other at an equal interval in a row direction (horizontal direction) or in a column direction (vertical direction) or the subpixels are disposed alternately and regularly. In particular, recently, an organic light emitting display device is widely used which has a checkerboard pattern structure in which a green subpixel and a blue subpixel are disposed in one pixel, a green subpixel and a red subpixel are disposed in the other pixel, and then each of the pixels are alternately disposed.

However, in this structure, all of the subpixels for three colors, red, green, and blue, are not disposed in a single pixel, and only the red and green subpixels are disposed in the single pixel, or only the blue and green subpixels are disposed in the single pixel, such that two colors are disposed in the single pixel. In this structure, a rendering technique, which controls and uses colors of adjacent pixels in order to generate an image with actual colors, is used. However, in comparison with the structure in which three colors are disposed in the single pixel, in the instance of the structure in which two colors are disposed in the single pixel, intervals between the subpixels are large, and a cognitive fill factor, which is substantially recognized by a user, deteriorates because three colors of light are not emitted.

In addition, in the instance of the organic light emitting display device which has a symmetrical pixel structure or a pixel structure having a checkerboard pattern as described above, there are problems in that lattice defects (artifacts) are visually recognized between the subpixels because of the regular arrangement of black matrixes, and there occurs a color fringe in which at an edge of a small-sized letter or picture, colors are blurred or a single color of the RGB colors is visually recognized.

An example of pixel array structure and organic light emitting display including the same is discussed in Korean Patent Publication No. 2014-0020120 (U.S. Pat. No. 9,324,262).

SUMMARY OF THE INVENTION

The inventors of the present disclosure recognized that symmetry and regularity are increased and thus a lattice defect occurs since subpixels in an organic light emitting display device are arranged to have a symmetrical structure or a checkerboard structure, and a cognitive fill factor deteriorates and thus the lattice defect becomes more severe as subpixels having only two colors are arranged in the single pixel. In addition, the inventors of the present disclosure recognized that a color fringe occurs since the subpixels are regularly arranged, the subpixel for a particular color is arranged to be biased toward one portion in the single pixel, and the subpixels are arranged in accordance with a predetermined scheme. Accordingly, the inventors of the present disclosure invented an organic light emitting display device in which each of the pixels is configured to share one of the subpixels with the adjacent pixel, the adjacent two pixels are configured to be asymmetrical to each other, and arranged in a pattern in which the adjacent pixels are repeated once in two periods, and as a result, it is possible to improve a cognitive fill factor and minimize a lattice defect and a color fringe.

An object to be achieved by the present disclosure is to provide an organic light emitting display device in which each of two pixels includes all of a green subpixel, a red subpixel, and a blue subpixel, and a single subpixel among the subpixels is configured to be shared by the two pixels, thereby improving a cognitive fill factor, which is substantially recognized by a user when implementing high resolution, even in a state in which the pixel has the same light emitting area.

Another object to be achieved by the present disclosure is to provide an organic light emitting display device capable of ensuring process characteristics by reducing the physical number of subpixels arranged in the single pixel.

Another object to be achieved by the present disclosure is to provide an organic light emitting display device in which the subpixels arranged in one pixel and the subpixels arranged in the adjacent pixel are arranged so as not to be symmetrical to each other, and thus the subpixels are uniformly distributed, thereby reducing a color fringe.

Another object to be achieved by the present disclosure is to provide an organic light emitting display device capable of increasing the period where the pixels become symmetrical, and thus reducing a lattice defect that may be visually recognized between the subpixels due to the regular arrangement of the subpixels.

The objects of the present disclosure are not limited to the aforementioned objects, and other objects, which are not mentioned above, will be apparent to a person having ordinary skill in the art from the following description.

According to an aspect of the present disclosure, an organic light emitting display device includes a first pixel and a second pixel being adjacent to each other, and each of the first pixel and the second pixel includes a plurality of subpixels. The first pixel and the second pixel share at least one subpixel of the plurality of subpixels.

An organic light emitting display device according to another example embodiment of the present disclosure includes a plurality of pixels. The plurality of pixels includes a first pixel and a second pixel, each of the first pixel and the second pixel including a plurality of subpixels. The first pixel shares at least one of the plurality of subpixels with a first adjacent pixel, and the second pixel shares at least one of the plurality of subpixels with a second adjacent pixel. The first pixel and the second pixel are adjacent to each other in a column direction, and the plurality of subpixels in each of the first pixel and the second pixel are arranged to be asymmetrical in the column direction.

According to another aspect of the present disclosure, an organic light emitting display device comprises subpixel groups including a plurality of subpixels, the subpixel groups being repeatedly arranged. Each of the subpixel groups includes a first subpixel unit and a second subpixel unit, each of the first subpixel unit and the second subpixel unit includes a single blue subpixel, two red subpixels, and two green subpixels. The two red subpixels of the first subpixel unit and the two green subpixels of the first subpixel unit are point-symmetrical with respect to a center of the blue subpixel of the first subpixel unit, respectively. The two red subpixels of the second subpixel unit and the two green subpixels of the second subpixel unit are asymmetrical with respect to a center of the blue subpixel of the second subpixel unit, respectively.

Details of other example embodiments will be included in the detailed description of the disclosure and the accompanying drawings.

According to the present disclosure, each of the pixels includes all of the green subpixel, the red subpixel, and the blue subpixel, and one of the subpixels is configured to be shared by the two adjacent pixels. As a result, it is possible to improve a cognitive fill factor when implementing high resolution even in a state in which the pixel has the same light emitting area.

According to the present disclosure, the green subpixel, the blue subpixel, and the red subpixel are arranged in the single pixel, and each of the subpixels are differently arranged for each column. As a result, it is possible to improve a cognitive fill factor.

According to the present disclosure, the physical number of subpixels arranged in the single pixel is reduced, and as a result, it is possible to improve efficiency of the manufacturing process and emit all of red light, green light, and blue light from the single pixel.

According to the present disclosure, the subpixels are arranged such that the adjacent pixels are not identical to each other or symmetrical to each other. Further, the subpixels are arranged such that the subpixels arranged in one pixel and the subpixels arranged in the adjacent pixel are not symmetrical to each other. As a result, it is possible to uniformly distribute the respective subpixels and thus reduce a color fringe.

According to the present disclosure, the subpixels arranged in one pixel and the subpixels disposed in the adjacent pixel are arranged so as not to be symmetrical to each other. As a result, it is possible to reduce a lattice defect in which a black lattice is visually recognized at a bank layer between the subpixels when light is emitted from the pixel. Further, it is possible to minimize a color fringe in which at an edge of an image, colors are blurred or a single color of the RGB colors is visually recognized.

According to the present disclosure, two pixel groups, which are vertically adjacent to each other, are alternately arranged to be repeated in two periods so that the pixels, which are horizontally adjacent to each other or adjacent to the left and right, are not symmetrical to each other. As a result, it is possible to provide the organic light emitting display device capable of increasing the period where the pixels become symmetrical, and thus reducing a lattice defect caused by the regular arrangement of the subpixels.

According to the present disclosure, the subpixels included in the single repeating unit are asymmetrical to each other and the period where the subpixels are repeated is large, and as a result, it is possible to improve a cognitive fill factor, and minimize a lattice defect and a color fringe.

The effects of the present disclosure are not limited to the aforementioned effects, and various other effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
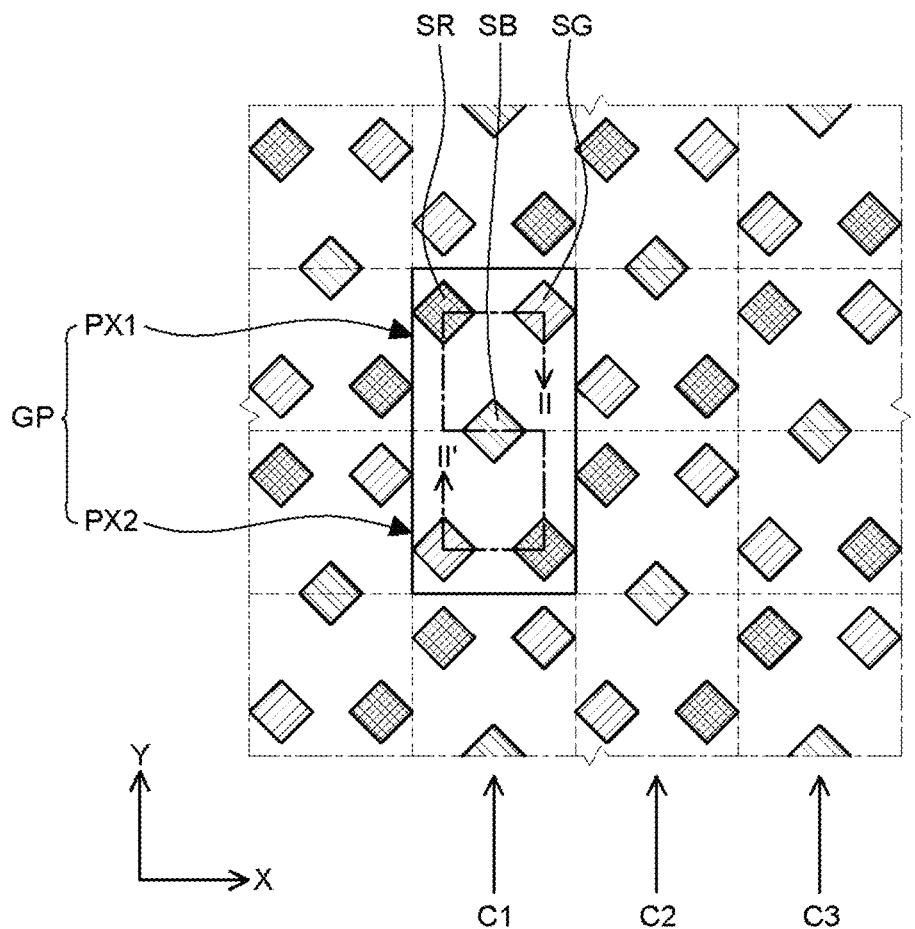
FIG. 1 is a schematic top plan view for explaining an organic light emitting display device according to an example embodiment of the present disclosure.

Advantages and features of the present disclosure, and methods for accomplishing the same will be more clearly understood from example embodiments described below with reference to the accompanying drawings. However, the present disclosure is not limited to the following example embodiments but may be implemented in various different forms. The example embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the example embodiments of the present disclosure are merely examples, and the present disclosure is not limited thereto. Same reference numerals generally denote same elements throughout the present specification. Further, in the following description, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways, and the embodiments can be carried out independently of or in association with each other.

Hereinafter, various example embodiments of the present disclosure will be described in detail with reference to the accompanying drawings.

FIG. 1 is a schematic top plan view for explaining an organic light emitting display device according to an example embodiment of the present disclosure. FIG. 1 schematically illustrates only a state in which some pixels and some subpixels, which constitute the organic light emitting display device, are disposed.

Referring to FIG. 1, an organic light emitting display device 100 includes a plurality of pixels. The plurality of pixels includes a plurality of subpixels, respectively. The subpixel is an element for displaying a single color, and includes a light emitting region from which light is emitted, and a non-light emitting region from which no light is emitted, but in the present specification, only the region from which light is emitted is defined as the subpixel. In FIG. 1, the hatched region refers to the subpixel. The subpixels display particular colors in the organic light emitting display device 100. For example, the subpixels include a red subpixel SR, a green subpixel SG and a blue subpixel SB, and emit red light, green light, and blue light, respectively. However, the subpixels of the organic light emitting display device 100 are not limited thereto, and the organic light emitting display device 100 may further include a white subpixel in addition to the red subpixel SR, the green subpixel SG, and the blue subpixel SB.

Referring to FIG. 1, each of the pixels of the organic light emitting display device 100 includes the green subpixel SG, the red subpixel SR, and the blue subpixel SB. Further, any one subpixel among the green subpixel, the red subpixel, and the blue subpixel is shared by a first pixel PX1 and a second pixel PX2. That is, each of the pixels includes the single green subpixel SG and the single red subpixel SR, and shares the blue subpixel SB with the other pixel positioned adjacent to one pixel in a column direction (Y-axis direction). In detail, the first pixel PX1 includes the single green subpixel SG and the single red subpixel SR at an upper portion thereof, and shares the single blue subpixel SB, at a lower portion thereof, with the second pixel PX2 positioned adjacent to the first pixel PX1. In addition, like the first pixel PX1, the second pixel PX2 includes the single green subpixel SG and the single red subpixel SR, and shares the blue subpixel SB with the first pixel PX1. Meanwhile, the subpixel, which is shared by the first pixel PX1 and the second pixel PX2, is not necessarily limited to the blue subpixel SB, and the subpixel, which is shared by the first pixel PX1 and the second pixel PX2, may be the green subpixel SG or the red subpixel SR in accordance with a design.

In this instance, the blue subpixel SB, which is shared by the first pixel PX1 and the second pixel PX2, may be positioned on a boundary line between the first pixel PX1 and the second pixel PX2. Further, a center of the blue subpixel SB may be positioned on the boundary line between the first pixel PX1 and the second pixel PX2 for the purpose of a design convenience and uniform distribution of the subpixels. Therefore, half of the blue subpixel SB shared by the first pixel PX1 and the second pixel PX2 is positioned in the first pixel PX1, and the remaining half of the blue subpixel SB is positioned in the second pixel PX2. And areas of the first pixel PX1 and the second pixel PX2, which are occupied by the shared blue subpixel SB, may be different from each other. In addition, in each of the pixels PX1 and PX2, the green subpixel SG and the red subpixel SR are arranged to be positioned in the same line. However, the arrangement of the subpixels in the organic light emitting display device 100 is not limited thereto, and the arrangement of the subpixels may be appropriately adjusted in accordance with a design.

And, an area of the shared blue subpixel SB may be equal to an area of each of the red subpixels SR and the green subpixels SG which are arranged in the first pixel PX1 and the second pixel PX2, respectively. Therefore, three colors may be displayed by the single pixel even in an instance in which the first pixel PX1 and the second pixel PX2 share the blue subpixel SB, and as a result, a cognitive fill factor may be improved.

In the organic light emitting display device 100 according to the example embodiment of the present disclosure, the first pixel PX1 and the second pixel PX2, which are adjacent to each other, each include the single green subpixel SG and the single red subpixel SR, and are arranged to share the blue subpixel SB. As a result, all of the red, green, and blue colors may be displayed by the single pixel. Unlike the organic light emitting display device in the related art in which two pixels, which each have two subpixels, are arranged in a checkerboard pattern and thus two colors are displayed by the single pixel, in the instance of the organic light emitting display device 100 illustrated in FIG. 1, the single pixel may display three colors even though the single pixel has a light emitting area similar to that of the single pixel in the related art. For this reason, a cognitive fill factor may be improved, and an image with higher resolution may be provided.

Here, the cognitive fill factor means a proportion of a region which is actually recognized as a light emitting region in the pixel by a user who uses a display device, unlike an aperture ratio of an opening region of the subpixel. The more improved the cognitive fill factor, the larger the region actually recognized by the user, and thus an image with high resolution may be recognized.

Referring to FIG. 1, the first pixel PX1 and the second pixel PX2, which are adjacent to each other in the column direction, that is, in a vertical direction, are vertically asymmetrical. The red subpixel SR of the first pixel PX1 is arranged at a left upper portion, and the green subpixel SG of the first pixel PX1 is arranged at a right upper portion, and the red subpixel SR of the second pixel PX2 is arranged at a left lower portion, and the green subpixel SG of the second pixel PX2 is arranged at a right lower portion. Therefore, each of the subpixels of the first pixel PX1 and the second pixel PX2 may be point-symmetrical, respectively, with respect to the center of the subpixel shared by the first pixel PX1 and the second pixel PX2. That is, the green subpixels SG and the red subpixels SR of the first pixel PX1 and the second pixel PX2 may be point-symmetrical with respect to the center of the blue subpixel SB which is the shared by the first pixel PX1 and the second pixel PX2. Therefore, the subpixels of the first pixel PX1 and the second pixel PX2 are arranged to be asymmetrical to each other in the column direction.

And, the red subpixel SR of the first pixel PX1 and the green subpixel SG of the second pixel PX2 are arranged in the same extended line in the column direction. And, the green subpixel SG of the first pixel PX1 and the red subpixel SR of the second pixel PX2 are arranged in the same extended line in the column direction.

In the organic light emitting display device in the related art, a subpixel for a particular color (e.g., a green subpixel) is arranged to be biased toward one portion of the pixel PX and the subpixels are arranged in accordance with a predetermined scheme. For this reason, there occurs a color fringe in which at an edge of a small-sized letter or picture, colors are blurred or a single color of the RGB colors is visually recognized. However, in the organic light emitting display device 100 according to the example embodiment of the present disclosure, the subpixels are arranged so that the first pixel PX1 and the second pixel PX2, which are vertically adjacent to each other, are vertically asymmetrical. As a result, the green subpixels SG, the red subpixels SR, and the blue subpixels SB may be entirely uniformly arranged in the pixels PX. And, with the vertically asymmetrical configuration of the first pixel PX1 and the second pixel PX2, the red subpixels SR and the green subpixels SG are alternately arranged in the column direction. As a result, the color fringe may be noticeably reduced in comparison with the structure in which the subpixels for emitting light with the same color are arranged in the same line in the column direction.

Referring to FIG. 1, the first pixel PX1 and the second pixel PX2 constitute a repeating pixel unit GP. The organic light emitting display device 100 according to the example embodiment of the present disclosure has a structure in which the repeating pixel units GP are repeated in a particular period (the period herein means a cycle or a length of the repeating pixel units). In more detail, the repeating pixel units GP are continuously arranged in the column direction (Y-axis direction). That is, in the organic light emitting display device 100, the first pixels PX1 and the second pixels PX2 are alternately arranged in the column direction (Y-axis direction). In this instance, the repeating pixel units GP arranged in the column direction (Y-axis direction) are vertically asymmetrical to each other.

And, the repeating pixel unit GP is asymmetrical with respect to another repeating pixel unit GP adjacent to the repeating pixel unit GP in a row direction (X-axis direction). That is, the repeating pixel unit GP in a first column C1 and the repeating pixel unit GP in a second column C2, which is right adjacent to the repeating pixel unit GP in the first column C1, are not arranged symmetrically and do not face each other side by side. In more detail, the repeating pixel unit GP in the first column C1 is arranged to be shifted downward as much as the size of the single pixel in comparison with the repeating pixel unit GP in the second column C2. Therefore, the blue subpixel SB arranged in one repeating pixel unit GP and the blue subpixel SB arranged in another repeating pixel unit GP, which is adjacent to the one repeating pixel unit GP in the row direction (X-axis direction), are not arranged in the same line.

And, the repeating pixel units GP may be continuously arranged in the column direction, and continuously arranged in the row direction in a state of being shifted by a predetermined distance in the column direction.

In other words, the repeating pixel units GP are repeatedly arranged every two periods in the row direction (X-axis direction). That is, based on the repeating pixel unit GP in the first column C1, the repeating pixel unit GP in the second column C2 is shifted downward as much as the length of the single pixel compared to the repeating pixel unit GP in the first column C1, and the repeating pixel unit GP in a third column C3 is shifted upward as much as the length of the single pixel compared to the repeating pixel unit GP in the second column C2. And, the repeating pixel unit GP in the third column C3 and the repeating pixel unit GP in the first column C1 are positioned in the same parallel line. That is, the blue subpixels SB of the repeating pixel units GP and the blue subpixels SB of the adjacent repeating pixel units GP are arranged in a zigzag pattern. And, the repeating pixel unit GP arranged in the first column C1 and the repeating pixel unit GP arranged in the second column C2 adjacent to the first column C1 are horizontally symmetrical to each other or symmetrical to each other right and left.

And, the repeating pixel unit GP may be divided into a first repeating pixel unit and a second repeating pixel unit. The first repeating pixel unit includes the first pixel PX1 and the second pixel PX2. The second repeating pixel unit is arranged adjacent to the first pixel PX1 in the column direction, and includes a third pixel and a fourth pixel. The fourth pixel and the third pixel are arranged to be adjacent to each other in the column direction. The first repeating pixel unit and the second repeating pixel unit may be adjacent to each other in the row direction, the third pixel may be configured to be identical to the first pixel PX1 in structure, and the fourth pixel may be configured to be identical to the second pixel PX2 in structure. And, the third pixel and the first pixel PX1 may have a horizontally symmetrical structure or a symmetrical structure to the left and right, and the fourth pixel and the second pixel PX2 may have a horizontally symmetrical structure or a symmetrical structure to the left and right.

In the organic light emitting display device 100 according to the example embodiment of the present disclosure, the period where the subpixels become symmetrical to each other is increased compared to the organic light emitting display device having a symmetrical structure in which the pixels are equally spaced apart from each other in the vertical direction or the horizontal direction or regularly and alternately arranged, or a checkerboard pattern structure in which the respective pixels are alternately arranged, thereby noticeably reducing a lattice defect. Therefore, it is possible to reduce a lattice defect visually recognized between the subpixels by the repetitive pattern, and as a result, it is possible to improve visibility and the cognitive fill factor.

Here, the lattice defect (artifact) means a defect in which a black lattice visually recognized at a bank layer between the subpixels when light is emitted from the pixel.

Figure 2:
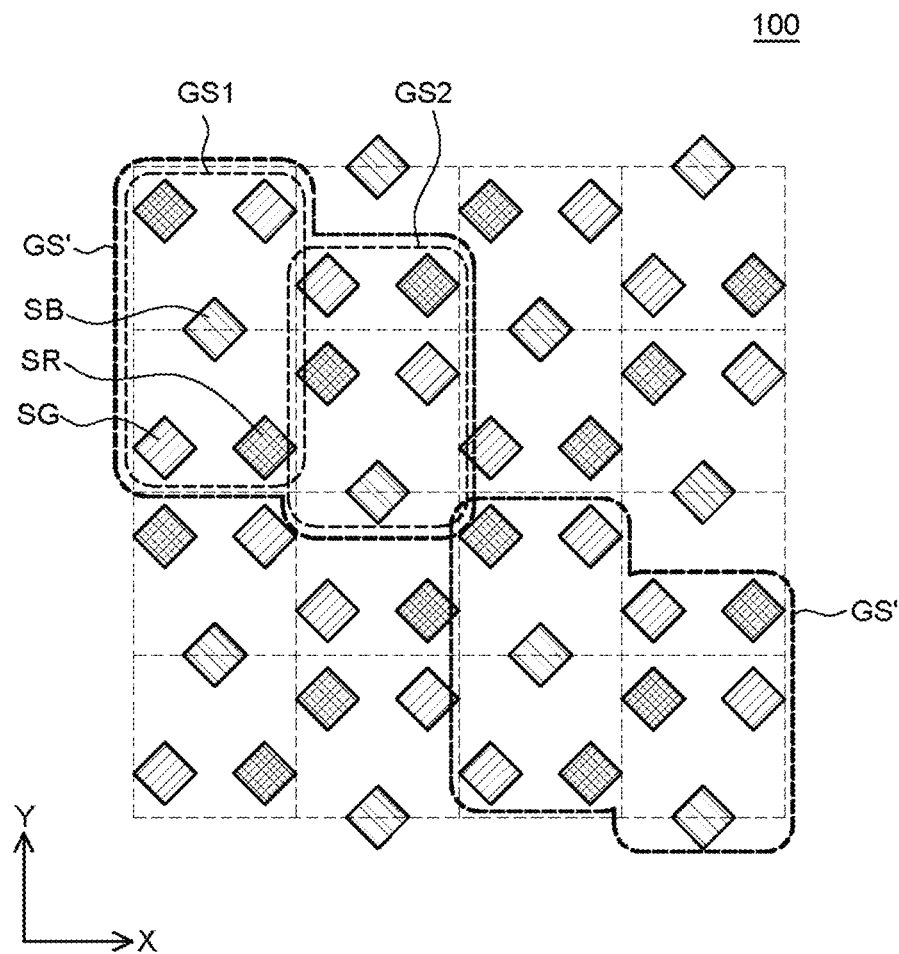
FIG. 2 is a schematic top plan view for explaining the organic light emitting display device according to the example embodiment of the present disclosure.

FIG. 2 is a schematic top plan view for explaining the organic light emitting display device according to the example embodiment of the present disclosure. FIG. 2 is a view separately illustrated to describe the organic light emitting display device 100 according to the example embodiment of the present disclosure in a manner different from that in which the description is made with reference to FIG. 1. Therefore, the organic light emitting display device in FIG. 2 has the same structure as the organic light emitting display device 100 illustrated in FIG. 1.

Referring to FIG. 2, in the organic light emitting display device 100, subpixel groups GS' including the plurality of subpixels may be repeatedly arranged. In this instance, the subpixel group GS' includes the first subpixel unit GS1 and the second subpixel unit GS2, each of which includes a single blue subpixel, two red subpixels, and two green subpixels.

In the first subpixel unit GS1, the subpixels having the same color are arranged to be point-symmetrical to each other with respect to the center of the blue subpixel. That is, in the first subpixel unit GS1, the two red subpixels are arranged to be point-symmetrical to each other with respect to the center of the blue subpixel, and the two green subpixels are arranged to be point-symmetrical to each other. In contrast, the subpixels in the second subpixel unit GS2 are configured to be asymmetrical to each other. Therefore, all of the subpixels in the single subpixel group GS' are entirely asymmetrical.

And, a first extended line, which runs through centers of the two red subpixels of the first subpixel unit GS1, and a second extended line, which runs through centers of the two green subpixels of the first subpixel unit GS1, run through the center of the blue subpixel of the first subpixel unit GS1. And, a third extended line, which runs through centers of the two red subpixels of the second subpixel unit GS2, and a fourth extended line, which runs through centers of the two green subpixels of the second subpixel unit GS2, do not run through the center of the blue subpixel of the second subpixel unit.

And, the subpixel groups GS' including the first subpixel units GS1 and the second subpixel units GS2 are arranged in the row direction or the column direction.

And, the subpixel group GS' including the first subpixel unit GS1 and the second subpixel unit GS2 includes two blue subpixels, four red subpixels, and four green subpixels. And, the four red subpixels and the four green subpixels in the subpixel group GS' are arranged in a zigzag pattern.

In the organic light emitting display device 100, the subpixels included in the single repeating unit are asymmetrical to each other and the period where the subpixels are repeated is large. As a result, it is possible to improve a cognitive fill factor, and minimize a lattice defect and a color fringe.

Figure 3:
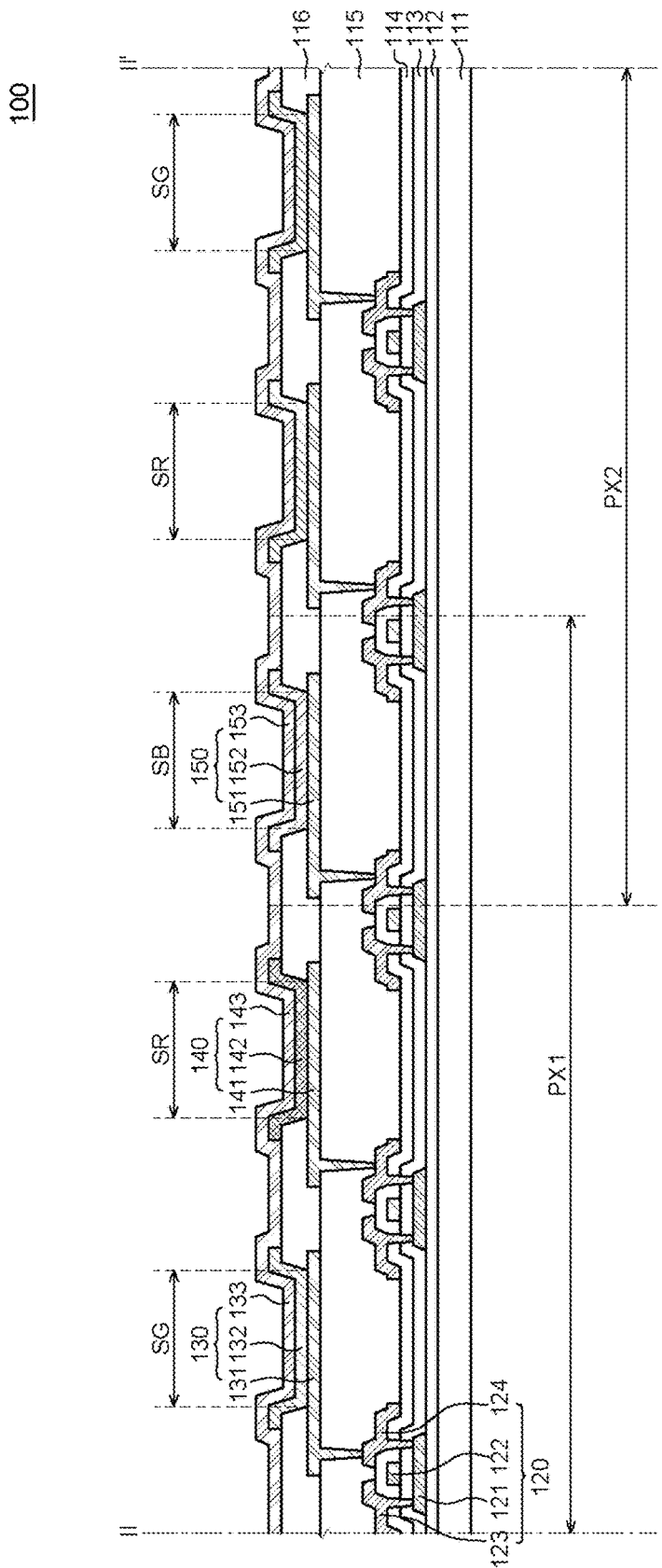
FIG. 3 is a schematic cross-sectional view taken along line II-II' of FIG. 1, for explaining the organic light emitting display device according to the example embodiment of the present disclosure.

FIG. 3 is a schematic cross-sectional view taken along line II-II' of FIG. 1, for explaining the organic light emitting display device 100 according to the example embodiment of the present disclosure.

Referring to FIG. 3, the first pixel PX1 independently includes a green subpixel SG, and shares the red subpixel SR and the blue subpixel SB with the second pixel PX2. Meanwhile, the green subpixel SG, the red subpixel SR, and the blue subpixel SB each include an organic light emitting element which emits light and a thin film transistor 120 which supplies driving voltage to the organic light emitting element. The thin film transistor 120 is provided one for each subpixel. The organic light emitting display device 100 according to the example embodiment of the present disclosure includes two pixels PX1 and PX2, and thus includes a total of four subpixels. Since the first pixel PX1 and the second pixel PX2 share the red subpixel SR and the blue subpixel SB, it is not necessary to provide three thin film transistors for each pixel in order to emit green light, red light, and blue light. That is, the two pixels PX1 and PX2 have the four thin film transistors, and may emit all of the lights with three colors for each pixel. The aforementioned configuration may be advantageous in terms of processes because the number of gate lines may be reduced from 6 to 4, and thus process time may be shortened.

And, since the thin film transistor which is configured to the green subpixel SG, the red subpixel SR, and the blue subpixel SB are substantially the same, and the organic light emitting element of the green subpixel SG, the red subpixel SR, and the blue subpixel SB is the substantially the same except for a material that constitutes an organic light emitting layer, the description will be made based on the green subpixel SG.

A substrate 111 serves to support and protect several constituent elements of the organic light emitting display device 100. The substrate 111 may be formed of an insulating material, for example, glass or a material having flexibility such as a polyimide-based material. In an instance in which the organic light emitting display device 100 is a flexible organic light emitting display device 100, the substrate may be formed of a flexible material such as plastic. In addition, in an instance in which the organic light emitting element, which may easily implement flexibility, is applied to a lighting apparats for a vehicle or a display device for a vehicle or an automotive display device, the lighting apparatus for a vehicle or the display device for a vehicle or the automotive display device may be variously designed and a degree of design freedom may be ensured in accordance with a structure or an external appearance of the vehicle.

And, the organic light emitting display device 100 according to another example embodiment of the present disclosure may be applied to display devices including TVs, mobile phones, tablet PCs, monitors, laptop computers, and display devices for a vehicle. Alternatively, the organic light emitting display device 100 may be applied to wearable display devices, foldable display devices, and rollable display devices.

A buffer layer 112 is disposed on the substrate 111. The buffer layer 112 inhibits moisture or impurities from penetrating through the substrate 111, and planarizes an upper portion of the substrate 111. However, the buffer layer 112 is not a necessarily required constituent element. Whether to form the buffer layer 112 is determined based on the type of substrate 111 or the type of thin film transistor 120 applied to the organic light emitting display device 100.

The thin film transistor 120 is disposed on the buffer layer 112, and supplies a signal to a green organic light emitting element 130. The thin film transistor 120 includes an active layer 121, a gate electrode 122, a source electrode 123, and a drain electrode 124. In detail, the active layer 121 is formed on the buffer layer 112, and a gate insulating layer 113 for insulating the active layer 121 and the gate electrode 122 is formed on the active layer 121. In addition, the gate electrode 122 is formed on the gate insulating layer 113 so as to overlap the active layer 121, and an interlayer insulating layer 114 is formed on the gate electrode 122 and the gate insulating layer 113. The source electrode 123 and the drain electrode 124 are formed on the interlayer insulating layer 114. The source electrode 123 and the drain electrode 124 are electrically connected with the active layer 121.

And, the active layer 121 may be formed of an amorphous silicon (a-Si), a polycrystalline silicon (poly-Si), an oxide semiconductor, or an organic semiconductor. In an instance in which the active layer 121 is formed of oxide semiconductor, the active layer 121 may be formed of, but is not limited to, ITO (indium tin oxide), IZO (indium zinc oxide), IGZO (indium gallium zinc oxide), or ITZO (indium tin zinc oxide).

For ease of description, FIG. 3 illustrates only a driving thin film transistor 120 connected with an anode 131 of a green organic light emitting element 130, among various thin film transistors 120 that may be included in the green subpixel SG. However, the green subpixel SG may further include a switching thin film transistor or a capacitor for driving the green organic light emitting element 130. In addition, in the present specification, the thin film transistor 120 is described as having a coplanar structure, but a thin film transistor 120 having an inverted staggered structure may also be used. In addition, a structure in which the anode of the organic light emitting element is connected with the source electrode 123 of the thin film transistor 120 is illustrated in the drawings. However, the anode 131 of the green organic light emitting element 130 may also be connected with the drain electrode 124 of the thin film transistor 120 in accordance with a design.

A planarization layer 115 is disposed on the thin film transistor 120. The planarization layer 115 is a layer that planarizes the upper portion of the substrate 111, and may be formed of an organic insulating material so as to cover stepped portions of the upper portion of the substrate 111. The planarization layer 115 includes contact holes for electrically connecting the anode 131 of the green subpixel SG, an anode 141 of the red subpixel SR, and an anode 151 of the blue subpixel SB with the source electrodes 123 of the thin film transistors 120.

The green organic light emitting element 130 is disposed on the planarization layer 115, and includes the anode 131, an organic layer 132, and a cathode 133.

The anode 131 is an electrode that supplies holes to the organic layer 132, and may be formed of a transparent conductive material having a high work function. Here, the transparent conductive material may include indium tin oxide (ITO), indium zinc oxide (IZO), and indium tin zinc oxide (ITZO). As illustrated in FIG. 3, in an instance in which the organic light emitting display device 100 is of a top emission type, the anode 131 may further include a reflective plate. Here, the anode 131 may be referred to as a pixel electrode.

The cathode 133 is an electrode that supplies electrons, and may be formed of a metallic material having a relatively low work function, for example, silver (Ag), titanium (Ti), aluminum (Al), molybdenum (Mo), or an alloy (Ag:Mg) of silver (Ag) and magnesium (Mg). Here, the cathode 133 may be referred to as a common electrode.

Each of the organic light emitting elements includes the organic layer 132. The organic light emitting display device 100 may have a patterned emission layer structure in accordance with a design. The organic light emitting display device having the patterned emission layer structure has a structure in which light emitting layers for emitting light with different colors are separated for each pixel. For example, a red organic light emitting layer for emitting red light, a green organic light emitting layer for emitting green light, and a blue organic light emitting layer for emitting blue light are separately configured on the red subpixel SR, the green subpixel SG, and the blue subpixel SB, respectively. In the red organic light emitting layer, the green organic light emitting layer, and the blue organic light emitting layer, the holes and the electrons, which are supplied through the anodes and the cathodes, are combined, thereby emitting light. Each of the organic light emitting layers may be deposited and patterned on each of the subpixels SR, SG, and SB through an apertured mask, for example, a fine metal mask (FMM).

The red organic light emitting layer, the green organic light emitting layer, and the blue organic light emitting layer include hosts and dopants. The host may be configured as a single host or a mixed host in which at least two hosts are mixed.

The host is a fluorescent host, and tris(8-hydroxy-quinolinato)aluminum ($Alq_3$), 9,10-di(naphth-2-yl)anthracene (ADN), 2-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), 2,7-bis(9,9-di(4-methylphenyl)-fluorene-2-yl)-9,9-di(4-methylphenyl) (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), 2-[9,9-di(4-methylphenyl)-fluorene-2-yl]-9,9-di(4-methylphenyl)fluorene (BDAF), or 4,4'-bis(2,2-diphenyl-ethene-1-yl)-4,4'-di-(tert-butyl)phenyl (p-TDPVBi) may be used.

As a phosphorescent host, 1,3-bis(carbazole-9-yl)benzene (MCP), 1,3,5-tris(carbazole-9-yl)benzene (TCP), 4,4',4"-tris(carbazole-9-yl)triphenylamine (TcTa), 4,4'-bis(carbazole-9-yl)biphenyl (CBP), 4,4'-bis(carbazole-9-yl)-2,2'-dimethylbiphenyl (CDBP), 2,7-bis(carbazole-9-yl)-9,9-dimethylfluorene (DMFL-CBP), 4,4'-bis(carbazole-9-yl)-9,9-bis(9-phenyl-9H-carbazole)fluorene (FL-4CBP), 2,7-bis(carbazole-9-yl)-9,9-di-tolylfluorene (DPFL-CBP), or 9,9-bis[4-(carbazole-9-yl)-phenyl]fluorene (FL-2CBP) may be used. However, the host is not limited to the listed examples.

The dopant receives transition energy of the host at the organic light emitting layer and emits light having a particular wavelength. Therefore, the red organic light emitting layer, the green organic light emitting layer, and the blue organic light emitting layer may be implemented by adjusting appropriate materials. As the dopant for emitting red light, there are Pt(II) octaethylpropene (PtOEP), tris[1-phenylisoquinoline]iridium (III) (Ir(piq)$_3$), 5,6,11,12-tetraphenylnaphthacene(rubrene), and 4-(dicyanomethylene)-2-tert-butyl-6-(1,1,7,7-tetramethyljulolidine-4-yl-vinyl)-4H-pyran (DCJTB). As the dopant for emitting green light, there are tris[2-phenylpyridine]iridium(III) (Ir(ppy)$_3$ (ppy=phenylpyridine), acetylacetonatebis(2-phenylpyridine)iridium(III) (Ir(ppy)$_2$(acac)), and tris[2-(p-tolyl)pyridine]iridium(III) (Ir(mppy)$_3$). As the dopant for emitting blue light, there are bis[4,6-difluorophenyl-pyridinato]iridium(III) (F$_2$Irpic), perylene, and ter-fluorene. However, the light emitting dopant is not limited to the listed examples.

In addition to the organic light emitting layer, common layers such as an injecting layer and a transporting layer may be further disposed between the anode 131 and the cathode 133 in order to improve light emitting efficiency of the organic light emitting element. At least some common layers among the common layers may have a common structure in which at least some common layers are disposed in common on the plurality of subpixels in order to obtain advantages during the manufacturing process.

Here, the layers having the common structure may be formed by using a common mask in which all of the subpixels are opened, and may be stacked on all of the subpixels with the same structure without having respective patterns for each subpixel. That is, the layers having the common structure are disposed to be connected or extended without a disconnected portion from one subpixel to a neighboring subpixel, and thus the layers are shared by the plurality of subpixels.

For example, in addition to the organic light emitting layer, a hole injecting layer or a p-type hole transporting layer formed by doping a hole transporting layer with a p-type dopant may be further disposed between the anode 131 and the cathode 133 in order to more smoothly move the positive hole. Further, the hole injecting layer or the p-type hole transporting layer may have a common structure which is disposed in common on the plurality of subpixels. Or, at least one among an electron transporting layer, an electron injecting layer, and a hole blocking layer may be further disposed between the anode 131 and the cathode 133 of the green organic light emitting element 130 in order to more smoothly move the electron into the organic light emitting layer. The electron transporting layer, the electron injecting layer, and the hole blocking layer may have a common structure which is disposed in common on the plurality of subpixels. The bank layer 116 is disposed to define the subpixel.

In detail, the bank layer 116 is disposed to cover at least a portion of an edge of the anode 131, and exposes a portion of an upper surface of the anode 131.

Figure 4:
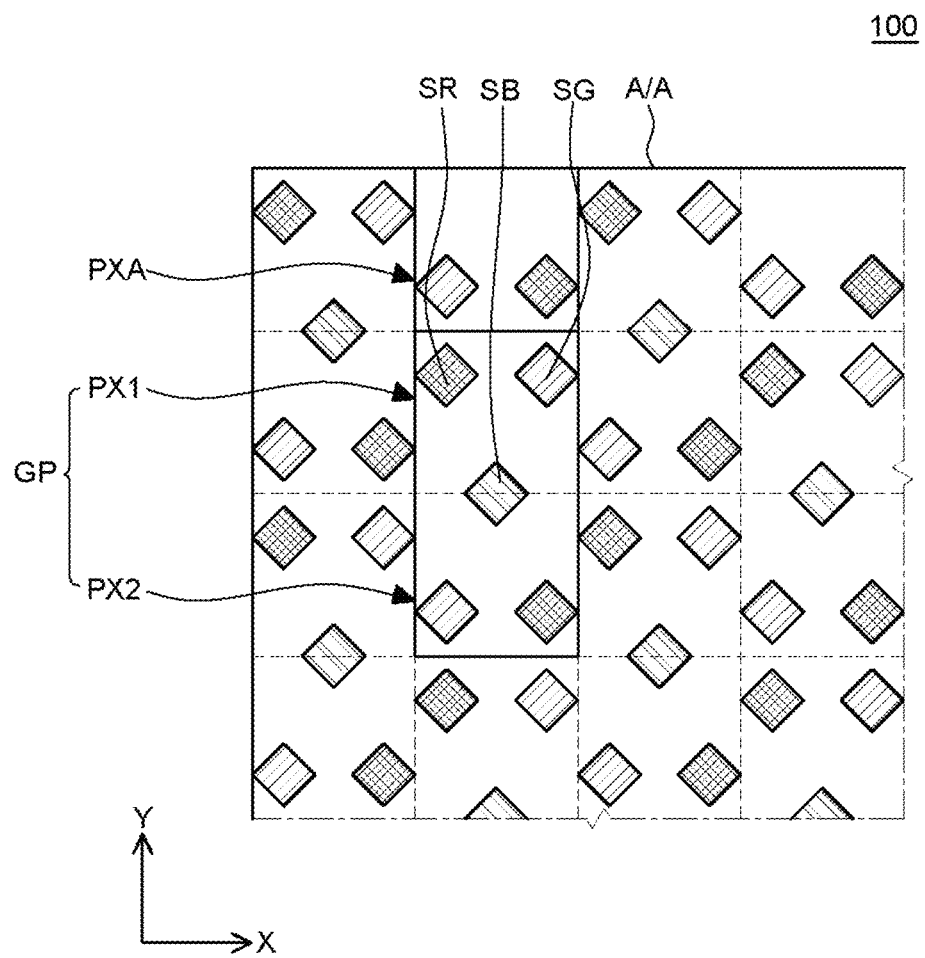
FIG. 4 is a schematic top plan view for explaining an outer periphery of an active area of the organic light emitting display device according to the example embodiment of the present disclosure.

FIG. 4 is a schematic top plan view for explaining an outer periphery of an active area (A/A) of the organic light emitting display device 100 according to the example embodiment of the present disclosure. FIG. 4 illustrates pixels positioned on a boundary line of the active area.

Referring to FIG. 4, in the organic light emitting display device 100, the first pixel PX1 and the second pixel PX2 each include the single green subpixel SG and the single red subpixel SR and share the blue subpixel SB, as illustrated in FIG. 1. In detail, in the first pixel PX1, the red subpixel SR is arranged at the left upper portion, the green subpixel SG is arranged at the right upper portion, and the blue subpixel SB shared by the second pixel PX2 is arranged at the center of the boundary line between the first pixel PX1 and the second pixel PX2. In addition, in the second pixel PX2, the blue subpixel SB shared by the first pixel PX1 is arranged at the upper portion, the green subpixel SG is arranged at the left lower portion, and the red subpixel SR is arranged at the right lower portion. However, in the instance of a pixel PXA which is adjacent to an upper edge of the first pixel PX1 and also adjacent to the boundary line of the active area A/A, the green subpixel SG and the red subpixel SR are arranged only at a lower portion of the pixel PXA, but no blue subpixel SB is arranged at an upper portion of the pixel PXA. That is, no blue subpixel SB is arranged in the pixel in which the blue subpixel SB needs to be arranged adjacent to the boundary line of the active area A/A.

The organic light emitting display device 100 according to the example embodiment of the present disclosure includes the first pixel PX1 and the second pixel PX2 which are vertically adjacent to each other, and the first pixel PX1 and the second pixel PX2 include the green subpixels, the red subpixels, and the blue subpixel. In this instance, the blue subpixel is shared by the first pixel PX1 and the second pixel PX2. The organic light emitting display device 100 according to the example embodiment of the present disclosure is configured such that the green subpixel and the red subpixel are included in the single pixel, and a part of the blue subpixel, which is shared by the adjacent pixels, is also included in the single pixel. As a result, it is possible to improve a cognitive fill factor when implementing high resolution even in a state in which the pixel has the same light emitting area. In addition, in the organic light emitting display device 100, the first pixel PX1 and the second pixel PX2, which are vertically adjacent to each other, are arranged to be vertically asymmetrical to each other. As a result, it is possible to minimize a color fringe that occurs as a subpixel for a particular color is biased to one portion of the pixel PX and disposed in accordance with a predetermined scheme. In addition, in the organic light emitting display device 100, the two pixel groups, which are vertically adjacent to each other, and the pixels, which are adjacent to the left and right portions of the two pixel groups, are arranged to be asymmetrical. As a result, it is possible to reduce a lattice defect in which a black lattice is visually recognized at the bank layer between the subpixels when light is emitted from the pixel.

Figure 5:
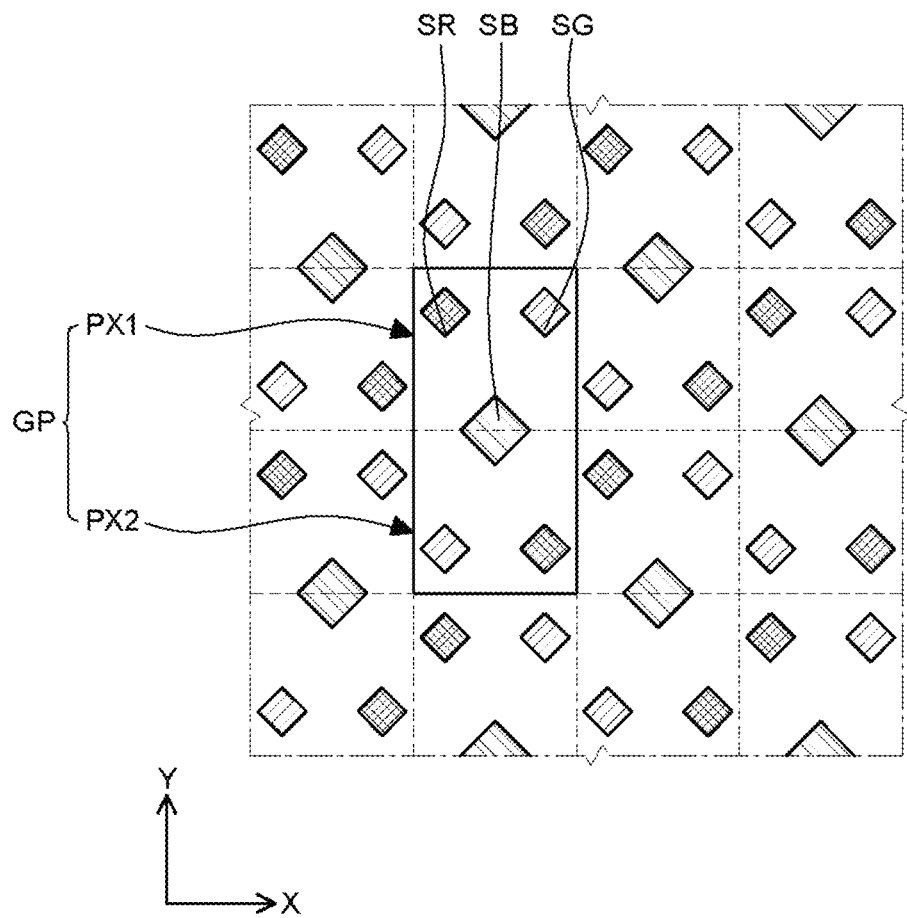
FIG. 5 is a schematic top plan view for explaining an organic light emitting display device according to another example embodiment of the present disclosure.

FIG. 5 is a schematic top plan view for explaining an organic light emitting display device 500 according to another example embodiment of the present disclosure. Because the organic light emitting display device 500 illustrated in FIG. 5 is identical to the organic light emitting display device 100 illustrated in FIG. 1 except that areas of the green subpixel SG, the red subpixel SR, and the blue subpixel SB are changed, a duplicated description thereof will be omitted or will be briefly made below. In the present specification, an area of each of the subpixels is defined as an area of the light emitting region of each of the subpixels.

Referring to FIG. 5, an area of the shared blue subpixel SB is larger than an area of each of the red subpixels SR and the green subpixels SG which are arranged in the first pixel PX1 and the second pixel PX2, respectively. In general, a lifespan of the blue subpixel SB is shorter than those of the red subpixel SR and the green subpixel SG, and as a result, the blue subpixel SB may be designed to have a larger light emitting area.

And, the areas of the subpixels are not limited thereto, and the areas of the subpixels may be formed to be different from each other in accordance with the type or the position of the subpixel shared by the first pixel PX1 and the second pixel PX2 in order to satisfy a desired color temperature, brightness, and lifespan. For example, in order to satisfy a color temperature of the organic light emitting display device, an area of the green subpixel SG may be smaller than an area of the blue subpixel SB or the red subpixel SR.

Figure 6:
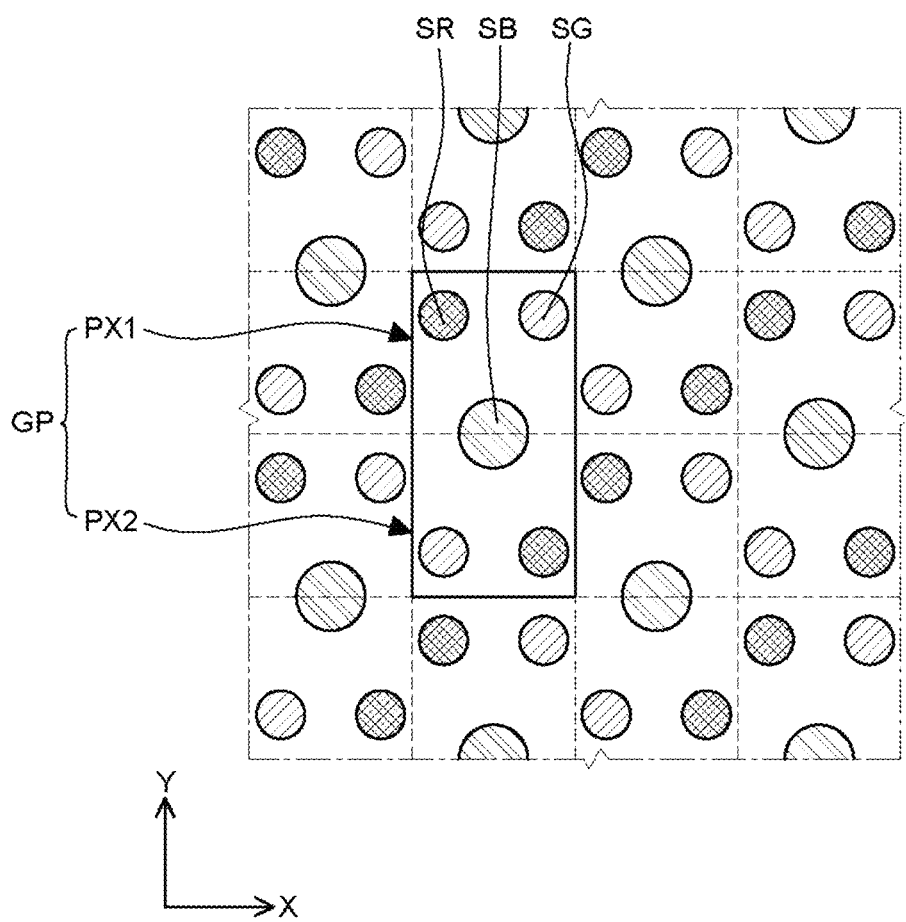
FIG. 6 is a schematic top plan view for explaining an organic light emitting display device according to another example embodiment of the present disclosure.

FIG. 6 is a schematic top plan view for explaining an organic light emitting display device 600 according to another example embodiment of the present disclosure. Since the organic light emitting display device 600 illustrated in FIG. 6 is identical to the organic light emitting display device 500 illustrated in FIG. 5 except that the subpixel has a circular shape, a duplicated description thereof will be omitted or will be briefly made below.

Referring to FIG. 6, the green subpixel SG, the red subpixel SR, and the blue subpixel SB are formed in a circular shape. Therefore, the organic light emitting display device 600 having a circular display region may be implemented in addition to the organic light emitting display device 500 having a rhombus or a diamond display region. In this instance, since the shape of the subpixel, that is, the shape of the light emitting region is circular, the subpixels may be more freely arranged. In this instance, each of the subpixels have symmetry.

That is, the red subpixel SR, the green subpixel SG, and the blue subpixel SB of the organic light emitting display device 600 are horizontally symmetrical, respectively, with respect to an arbitrary straight line that runs through the center of the subpixel. In this instance, it is possible to minimize a defect of the subpixel which may occur during a process of manufacturing the organic light emitting display device 600.

In detail, the organic light emitting layers, which constitute the respective subpixels, may be patterned and deposited by using a mask opened for each subpixel, for example, a fine metal mask (FMM). Because the FMM has a thin metal structure, the FMM may be sagged or curved by gravity during a mask deposition process. In this instance, a region on which the organic light emitting layer is deposited may be distorted, and precision of the deposition process may deteriorate. To avoid the aforementioned problem, the FMM may be pulled in a particular direction during the mask deposition process. However, in this instance, tensile force is exerted on an opening region of the FMM, and different tensile force is created for each portion of the opening region in accordance with a shape of the opening region of the FMM, and as a result, the shape of the opening region may be deformed. If the opening region of the FMM is deformed, the organic light emitting layer cannot be deposited at an exact position, and as a result, the subpixels may overlap each other. For this reason, a defect of the subpixel may occur. In contrast, in an instance in which the subpixel has a symmetrical shape, the same tensile force is exerted on the opening region of the FMM even though the FMM is pulled during the mask deposition process. Therefore, stress exerted on the FMM opening region is dispersed because of the symmetry of the opening region, and thus deformation of the opening region of the FMM may be minimized. Therefore, it is possible to minimize a defect rate or defects of the subpixel which may occur during the mask deposition process.

And, the subpixel has a circular shape as illustrated in FIG. 6, but the subpixel may have other symmetrical shape such as a square, a regular hexagon, and a regular octagon.

Since the subpixels of the organic light emitting display device 600 according to still another example embodiment of the present disclosure have symmetry, stress exerted on the opening region of the FMM may be dispersed during the deposition process using the FMM, and deformation of the FMM may be minimized, and as a result, precision of the deposition process may be improved.

Figure 7:
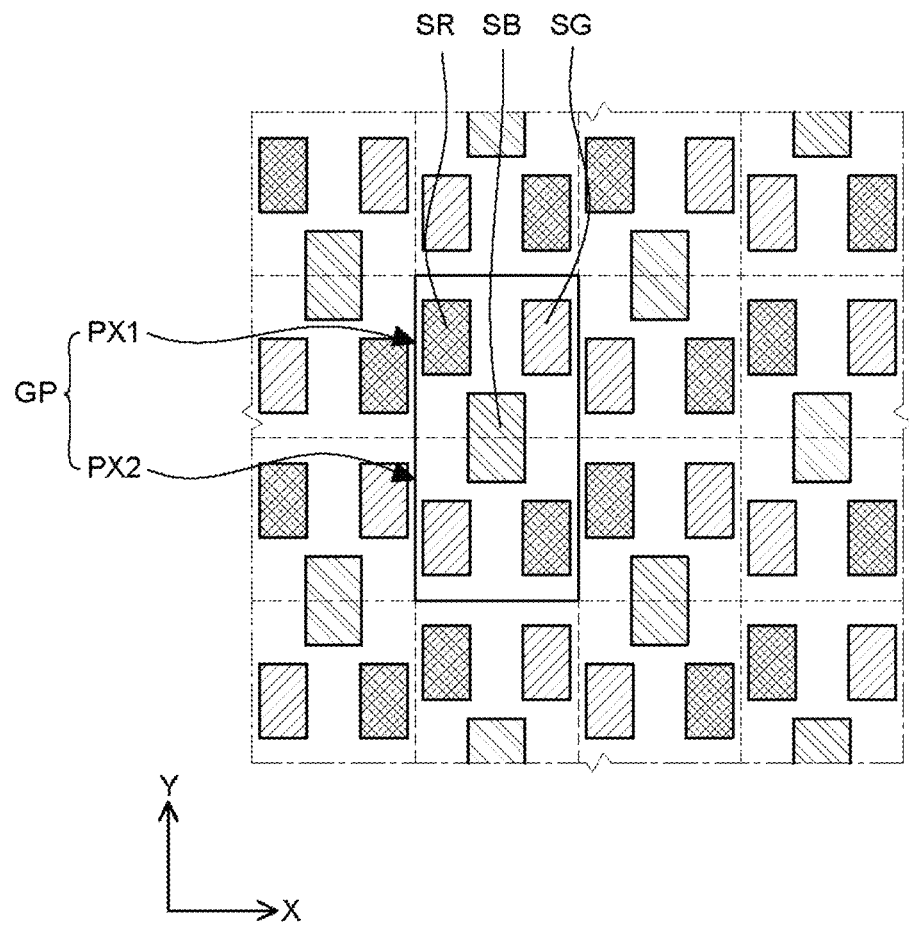
FIG. 7 is a schematic top plan view for explaining an organic light emitting display device according to another example embodiment of the present disclosure.

FIG. 7 is a schematic top plan view for explaining an organic light emitting display device 700 according to another example embodiment of the present disclosure. Because the organic light emitting display device 700 illustrated in FIG. 7 is identical to the organic light emitting display device 500 illustrated in FIG. 5 except that the subpixel has a rectangular shape, a duplicated description thereof will be omitted or will be briefly made below.

Referring to FIG. 7, the green subpixel SG, the red subpixel SR, and the blue subpixel SB are formed in a rectangular shape elongated in the column direction (Y-axis direction).

The subpixel having an asymmetrical shape may be formed in accordance with a size and an interval of the opening region of the FMM. In more detail, in an instance in which an interval between the opening regions of the FMM is small, it is possible to minimize a phenomenon in which the FMM is sagged or curved by gravity during the mask deposition process. Therefore, as illustrated in FIG. 7, the subpixel may be configured to have an asymmetrical shape.

Figure 8:
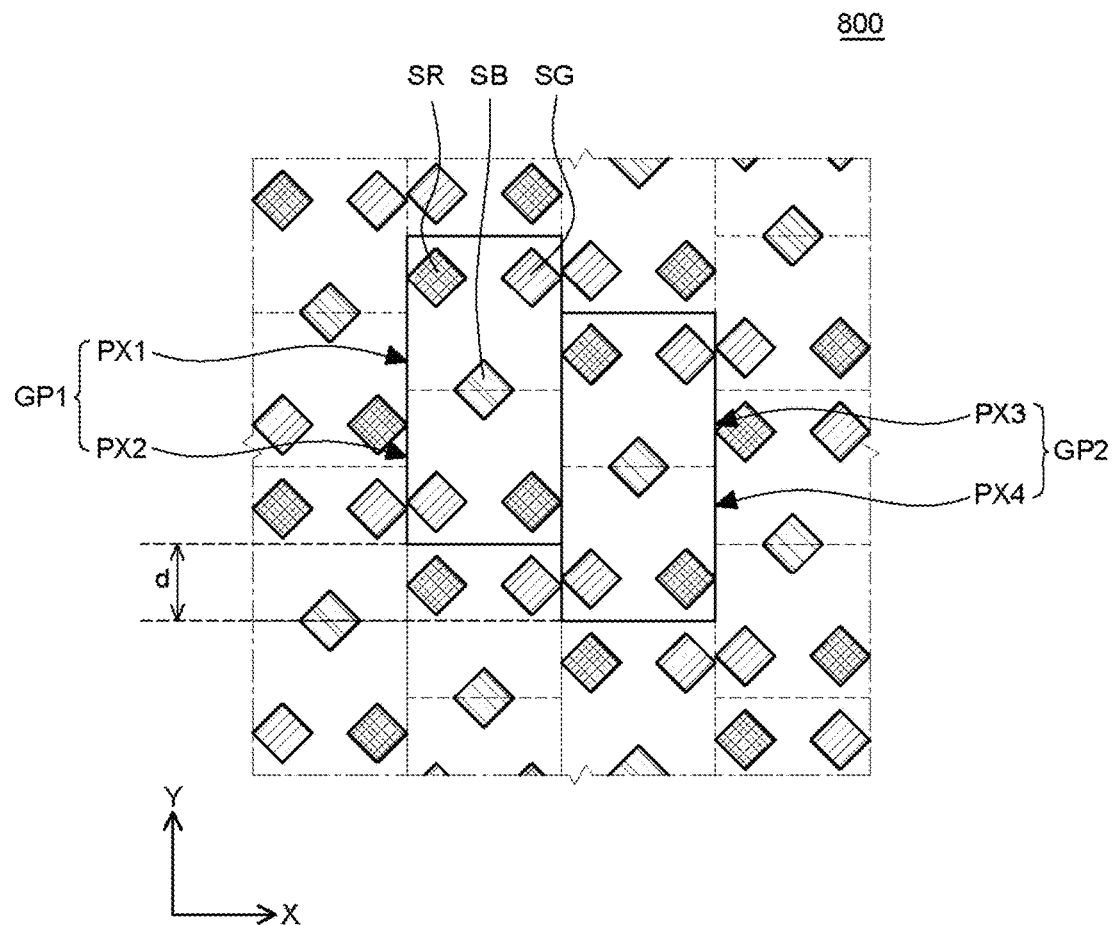
FIG. 8 is a schematic top plan view for explaining an organic light emitting display device according to another example embodiment of the present disclosure.

FIG. 8 is a schematic top plan view for explaining an organic light emitting display device 800 according to another example embodiment of the present disclosure. Because the organic light emitting display device 800 illustrated in FIG. 8 is identical to the organic light emitting display device 100 illustrated in FIG. 1 except that positions of the pixels are changed, a duplicated description thereof will be omitted or will be briefly made below.

Referring to FIG. 8, the organic light emitting display device 800 includes a first repeating pixel unit GP1 including a first pixel PX1 and a second pixel PX2, and a second repeating pixel unit GP2 including a third pixel PX3 and a fourth pixel PX4. In this instance, the first repeating pixel units GP1 constitute a first column, and are repeatedly arranged in the column direction (Y-axis direction). The second repeating pixel units GP2 constitute a second column adjacent to the first column, and are repeatedly arranged in the column direction (Y-axis direction). In this instance, the second repeating pixel unit GP2 is arranged to be shifted downward by a particular distance d in comparison with the first repeating pixel unit GP1. That is, the second repeating pixel unit GP2 and the first repeating pixel unit GP1 have the particular distance d.

Unlike the organic light emitting display device 100 illustrated in FIG. 1 in which the second repeating pixel unit GP2 is arranged to be shifted downward as much as the distance of the single pixel in comparison with the first repeating pixel unit GP1, in the organic light emitting display device 800 illustrated in FIG. 8, the second repeating pixel unit GP2 is arranged to be shifted downward by the distance d shorter than the length of the single pixel. For example, the second repeating pixel unit GP2 is arranged to be shifted downward by half of the distance of the single pixel. In this instance, based on the first repeating pixel unit GP1 that constitutes the first column, a repeating pixel unit, which constitutes a fifth column, and the first repeating pixel unit GP1 are positioned in the same parallel line. That is, the repeating pixel units, which constitute the organic light emitting display device 800, have a pattern in which the repeating pixel units are repeated every four periods in the row direction (X-axis direction).

In the organic light emitting display device 800 according to another example embodiment of the present disclosure, the period where the subpixels become symmetrical to each other is increased, and as a result, a lattice defect may be reduced, and a cognitive fill factor may be improved. In this instance, the distance d between the first repeating pixel unit GP1 and the second repeating pixel unit GP2 is half of the length of the single pixel, but the distance d is not limited to the half of the length of the single pixel, and may be appropriately adjusted in accordance with a design by a user.

Figure 9:
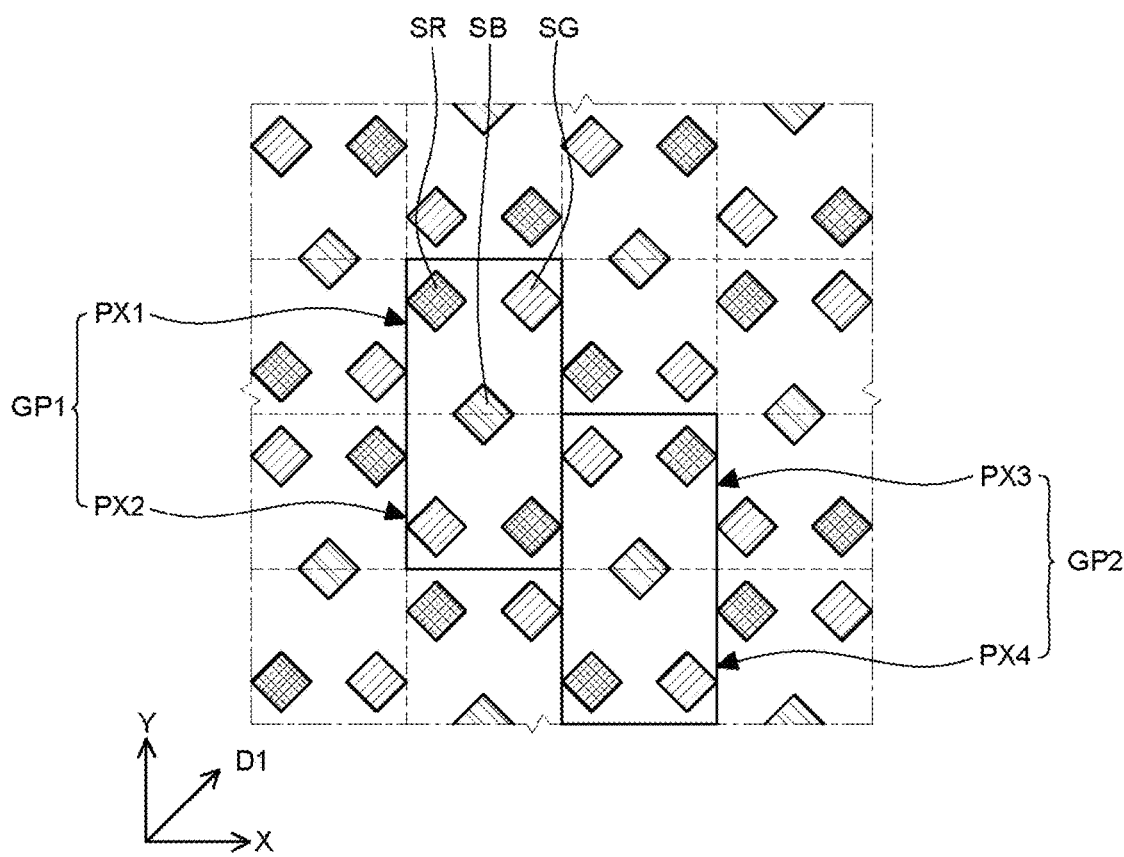
FIG. 9 is a schematic top plan view for explaining an organic light emitting display device according to another example embodiment of the present disclosure.

FIG. 9 is a schematic top plan view for explaining an organic light emitting display device 900 according to another example embodiment of the present disclosure. Because the organic light emitting display device 900 illustrated in FIG. 9 is identical to the organic light emitting display device 100 illustrated in FIG. 1 except that the arrangement of the subpixels arranged in the second column is changed, a duplicated description thereof will be omitted or will be briefly made below.

Referring to FIG. 9, the organic light emitting display device 900 includes a first repeating pixel unit GP1 including a first pixel PX1 and a second pixel PX2, and a second repeating pixel unit GP2 including a third pixel PX3 and a fourth pixel PX4. In this instance, the first repeating pixel units GP1 constitute a first column, and are repeatedly arranged in the column direction (Y-axis direction). The second repeating pixel units GP2 constitute a second column adjacent to the first column, and are repeatedly arranged in the column direction (Y-axis direction). In this instance, the subpixels in the second repeating pixel unit GP2 and the subpixels in the first repeating pixel unit GP1 are arranged symmetrically to each other. The organic light emitting display device 100 illustrated in FIG. 1 differs from the organic light emitting display device 900 illustrated in FIG. 9 in that the subpixels in the repeating pixel unit arranged in the first column and the subpixels in the repeating pixel unit arranged in the second column are arranged to overlap each other.

In more detail, in the first pixel PX1 of the first repeating pixel unit GP1, the red subpixel SR is arranged at the left upper portion, and the green subpixel SG is arranged at the right upper portion, but in the third pixel PX3 of the second repeating pixel unit GP2, the green subpixel SG is arranged at the left upper portion, and the red subpixel SR is arranged at the right upper portion. That is, the subpixels are arranged in the third pixel PX3 of the second repeating pixel unit GP2 in the same manner as the subpixels arranged in the first pixel PX1 of the first repeating pixel unit GP1, and the subpixels in the third pixel PX3 of the second repeating pixel unit GP2 and the subpixels in the first pixel PX1 of the first repeating pixel unit GP1 are arranged to be symmetrical to each other. Likewise, the subpixels in the second pixel PX2 of the first repeating pixel unit GP1 and the subpixels in the fourth pixel PX4 of the second repeating pixel unit GP2 are arranged to be symmetrical to each other.

In an instance in which the subpixels are disposed like the organic light emitting display device 900 illustrated in FIG. 9, the subpixels in above a diagonal line or below a diagonal line are alternately arranged. In detail, based on the green subpixel SG of the first pixel PX1 of the first repeating pixel unit GP1, the green subpixels SG and the red subpixels SR are alternately arranged in a first diagonal direction D1. In addition, based on the red subpixel SR of the second pixel PX2 of the first repeating pixel unit GP1, the green subpixels SG and the red subpixels SR are arranged alternately two times in the first diagonal direction D1. Therefore, in the organic light emitting display device 900, the red subpixels SR and the green subpixels SG are alternately arranged in the column direction, and the red subpixels SR and the green subpixels SG are also alternately arranged in the diagonal direction, and as a result, it is possible to noticeably reduce a color fringe in the diagonal direction. However, even in an instance in which the subpixels in the first repeating pixel unit GP1 and the subpixels in the second repeating pixel unit GP2 are arranged to be symmetrical to each other, the subpixels may necessarily not be alternately arranged in the diagonal direction. The reason is that the types and the positions of the subpixels positioned in the diagonal direction may vary depending on the arrangement of the subpixels in the respective pixels, intervals between the subpixels, and sizes of the subpixels.

To investigate effects of the present disclosure, an example embodiment and a comparative example, in which the subpixels are differently arranged, are evaluated by using simulations. In detail, the example embodiment has the subpixel structure illustrated in FIG. 5. In contrast, the comparative example has the subpixel structure illustrated in FIG. 10.

Figure 10:
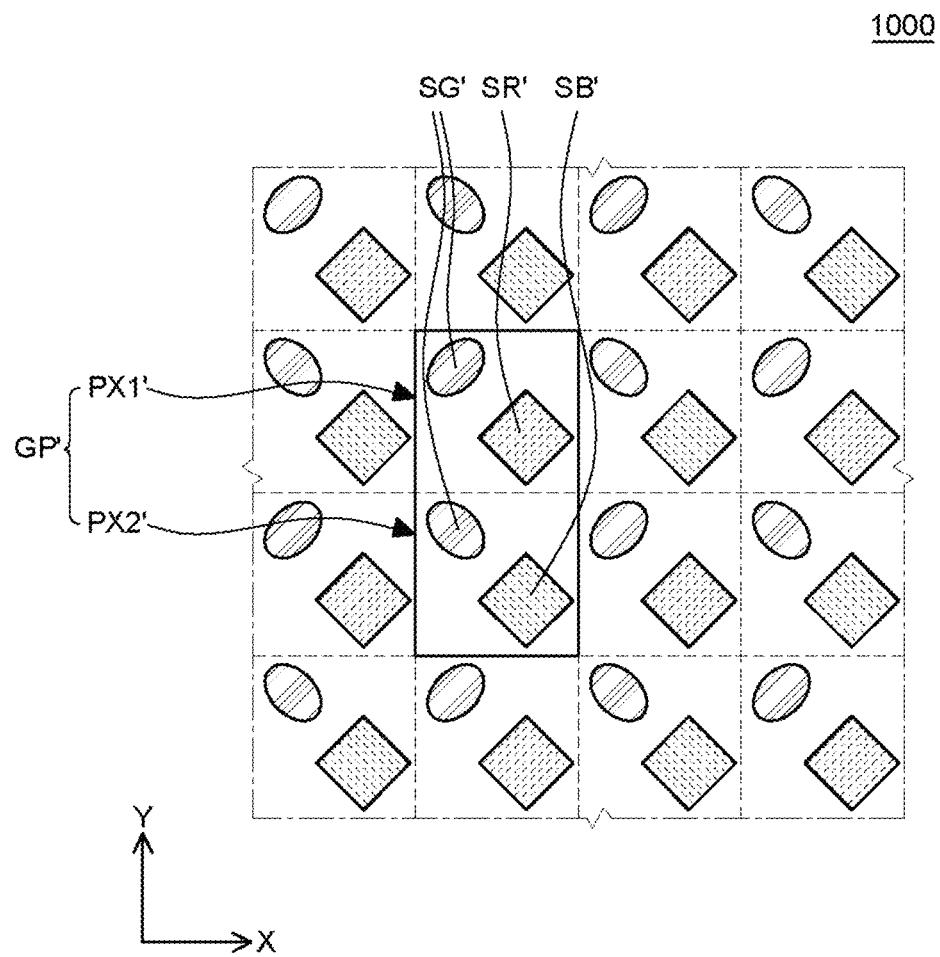
FIG. 10 is a schematic top plan view for explaining an organic light emitting display device according to a comparative example.

In this instance, FIG. 10 is a schematic top plan view for explaining an organic light emitting display device according to the comparative example. In detail, an organic light emitting display device 1000 illustrated in FIG. 10 has a checkerboard pattern structure that includes first pixels PX1', each of which includes a green subpixel SG' positioned at a left upper end thereof and a red subpixel SR' positioned at a right lower end thereof, and second pixels PX2', each of which includes a green subpixel SG' positioned at a left upper end thereof and a blue subpixel SB' positioned at a right lower end thereof, in which the first pixels PX1' and the second pixels PX2' are alternately arranged. The simulation results of the comparative example and the example embodiment are illustrated in FIGS. 11A and 11B, respectively.

Figure 11A:
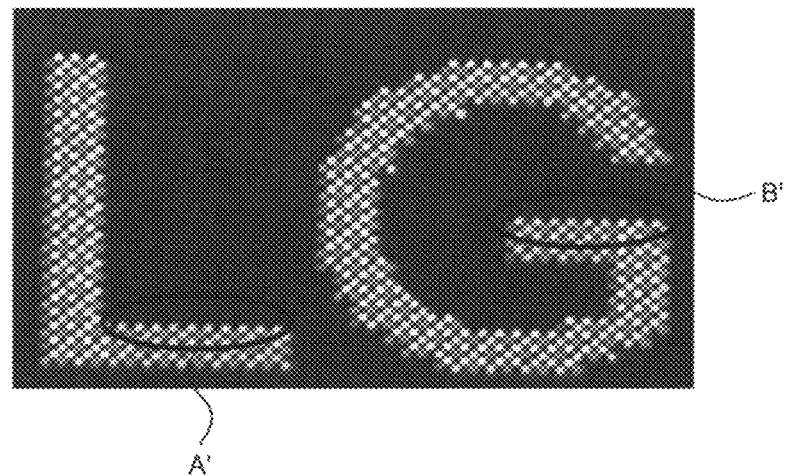
FIG. 11A is an image illustrating a simulation implemented by the organic light emitting display device according to the comparative example.
Figure 11B:
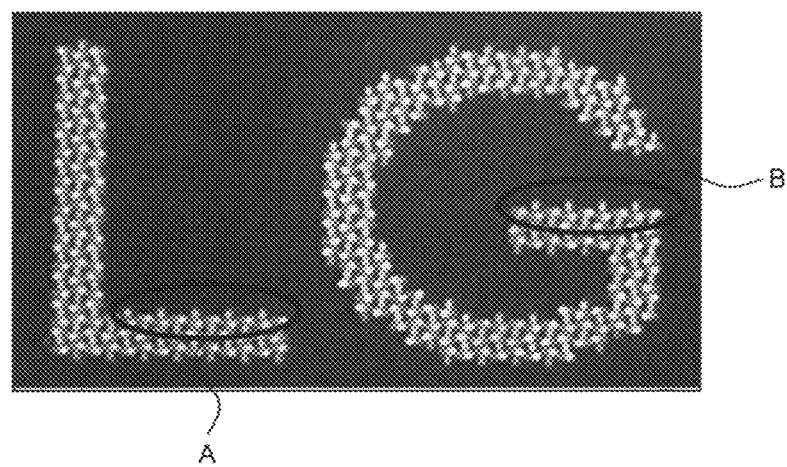
FIG. 11B is an image illustrating a simulation implemented by the organic light emitting display device according to the example embodiment of the present disclosure.

FIGS. 11A and 11B are images illustrating simulations implemented by the organic light emitting display devices according to the comparative example and the example embodiment.

First, referring to FIG. 11A, in region A' and region B' of the simulation implemented by the comparative example, all edge portions of letters are displayed in green, and as a result, a color fringe is found which is visually recognized as a solid line displayed in a single color. However, referring to FIG. 11B, in region A and region B of the simulation implemented by the example embodiment, blue and red/green colors are alternately displayed in a zigzag pattern, and as a result, it can be seen that there occurs no color fringe in which an edge of a letter is shown in a single color.

In addition, generally referring the letters illustrated in FIG. 11A, it can be seen that black lattice shapes are clearly shown between the respective subpixels. That is, the lattice defect is intensely and visually recognized. However, referring to FIG. 11B, no black rectilinear lattice shape occurs because the period where the subpixels become symmetrical is large and there are a number of asymmetrical portions. That is, it can be seen that in the organic light emitting display device according to the example embodiment of the present disclosure, the lattice defect is noticeably reduced compared to the comparative example.

The example embodiments of the present disclosure can also be described as follows:

According to an aspect of the present disclosure, an organic light emitting display device includes a first pixel, and a second pixel being adjacent to the first pixel, and each of the first pixel and the second pixel includes a plurality of subpixels. In this instance, the first pixel and the second pixel share at least one subpixel of the plurality of subpixels. The organic light emitting display device according to the example embodiment of the present disclosure is configured such that each of the plurality of subpixels includes all of a green subpixel, a red subpixel, and a blue subpixel, and a single subpixel is shared by adjacent pixels, and as a result, it is possible to improve a cognitive fill factor.

According to one or more embodiments of the present disclosure, the plurality of subpixels may include a green subpixel, a red subpixel, and a blue subpixel, and the blue subpixel may be shared by the first pixel and the second pixel.

According to one or more embodiments of the present disclosure, the first pixel and the second pixel may be vertically adjacent to each other.

According to one or more embodiments of the present disclosure, the blue subpixel may be equally shared by the first pixel and the second pixel.

According to one or more embodiments of the present disclosure, the first pixel and the second pixel may be symmetric relative to the shared blue subpixel.

According to one or more embodiments of the present disclosure, the blue subpixel may be the same as or larger than each of the green subpixel and the red subpixel.

According to one or more embodiments of the present disclosure, an area of an emission region of the at least one subpixel that is shared may be the same as or larger than areas of emission regions of non-shared subpixels of the plurality of subpixels.

According to one or more embodiments of the present disclosure, the emission regions of the plurality of subpixels may have one of a diamond shape, a round shape, and a rectangular shape.

According to one or more embodiments of the present disclosure, the at least one shared subpixel may have one anode electrode.

According to one or more embodiments of the present disclosure, the at least one subpixel that is shared may be disposed between the non-shared subpixels of the plurality of subpixels in the first and second pixels.

According to one or more embodiments of the present disclosure, the non-shared subpixels may be aligned in a vertical direction.

According to one or more embodiments of the present disclosure, the non-shared subpixels of the plurality of subpixels of the first pixel and the second pixel may be symmetric relative to a center of the at least one subpixel that is shared.

According to one or more embodiments of the present disclosure, the first pixel and the second pixel may be adjacent to each other in a column direction, and the first pixel and the second pixel may be vertically asymmetrical.

According to one or more embodiments of the present disclosure, each subpixel of the first pixel and the second pixel may be point-symmetrical with respect to the center of the at least one subpixel shared by the first pixel and the second pixel.

According to one or more embodiments of the present disclosure, the first pixel and the second pixel may constitute a repeating pixel unit, a plurality of repeating pixel units may be continuously arranged in a column direction, and continuously arranged in a row direction by being shifted by a predetermined distance in the column direction.

According to one or more embodiments of the present disclosure, the plurality of repeating pixel units may be repeatedly arranged every two periods in the row direction.

According to one or more embodiments of the present disclosure, subpixels of the plurality of subpixels which are shared by first pixels and second pixels in the plurality of repeating pixel units may be arranged in a zigzag pattern in the row direction.

According to one or more embodiments of the present disclosure, the plurality of repeating pixel units arranged in a first column and the plurality of repeating pixel units arranged in a second column adjacent to the first column may be horizontally symmetrical to each other.

According to one or more embodiments of the present disclosure, the organic light emitting display device may further includes a first repeating pixel unit having a third pixel adjacent to the first pixel in a row direction, and a fourth pixel adjacent to the second pixel in the row direction and adjacent to the third pixel in the column direction, the third pixel and the first pixel may have a symmetrical structure in the row direction, and the fourth pixel and the second pixel may have a symmetrical structure in the row direction.

According to another aspect of the present disclosure, an organic light emitting display device comprises a plurality of pixels. The plurality of pixels include a first pixel and a second pixel, each of the plurality of pixels including a plurality of subpixels, the first pixel shares at least one of the plurality of subpixels with a first adjacent pixel, and the second pixel shares at least one of the plurality of subpixels with a second adjacent pixel, and the first pixel and the second pixel are adjacent to each other in a column direction, and the plurality of subpixels in each of the first pixel and the second pixel are arranged to be asymmetrical in the column direction. In the organic light emitting display device according to another example embodiment of the present disclosure, each of the pixels includes all of a green subpixel, a red subpixel, and a blue subpixel, and shares a single subpixel with an adjacent pixel. Further, the adjacent pixels are configured to be asymmetrical to each other, and arranged in a pattern in which the adjacent pixels are repeated every two periods. As a result, it is possible to improve a cognitive fill factor and minimize a lattice defect and a color fringe.

According to one or more embodiments of the present disclosure, the plurality of subpixels may include a green subpixel, a red subpixel, and a blue subpixel, and the blue subpixel may be the shared subpixel.

According to one or more embodiments of the present disclosure, the first pixel and the second pixel may be vertically adjacent to each other, whereby the first adjacent pixel may be the second pixel, and the second adjacent pixel may be the first pixel, and the first pixel and the second pixel may share the same blue subpixel.

According to one or more embodiments of the present disclosure, the first pixel and the second pixel may be horizontally adjacent to each other, whereby the blue subpixel may not be shared by the first pixel and the second pixel.

According to one or more embodiments of the present disclosure, an area of an emission region of the at least one subpixel that is shared may be the same as or larger than areas of emission regions of non-shared subpixels of the plurality of subpixels in each of the first pixel and the second pixel.

According to one or more embodiments of the present disclosure, the emission regions of the plurality of subpixels may have one of a diamond shape, a round shape, and a rectangular shape.

According to one or more embodiments of the present disclosure, the at least one shared subpixel may have one anode electrode.

According to one or more embodiments of the present disclosure, the at least one subpixel that is shared may be disposed between the non-shared subpixels of the plurality of subpixels in the plurality of pixels.

According to one or more embodiments of the present disclosure, the non-shared subpixels may be aligned in a vertical direction.

According to one or more embodiments of the present disclosure, the non-shared subpixels of the plurality of subpixels of the first pixel and the second pixel may be symmetric relative to a center of the at least one subpixel that is shared.

According to one or more embodiments of the present disclosure, the plurality of subpixels may include a first subpixel, a second subpixel, and a third subpixel, and the first subpixel of the first pixel and the second subpixel of the second pixel may be arranged in the same extended line in the column direction, and the second subpixel of the first pixel and the first subpixel of the second pixel may be arranged in the same extended line in the column direction.

According to one or more embodiments of the present disclosure, the first pixel and the second pixel adjacent to the first pixel in the column direction may constitute a first repeating pixel unit, and the plurality of pixels may further comprise a third pixel and a fourth pixel, and the third pixel and the fourth pixel adjacent to the third pixel in the column direction may constitute a second repeating pixel unit, the first repeating pixel unit and the second repeating pixel unit may be adjacent to each other in a row direction, the third pixel may be substantially identical to the first pixel in structure, and the fourth pixel may be substantially identical to the second pixel in structure.

According to one or more embodiments of the present disclosure, the first pixel and the second pixel adjacent to the first pixel in the column direction may constitute a first repeating pixel unit,and the plurality of pixels may further comprise a third pixel and a fourth pixel, and the third pixel and the fourth pixel adjacent to the third pixel in the column direction may constitute a second repeating pixel unit, the first repeating pixel unit and the second repeating pixel unit may be adjacent to each other in a row direction, the third pixel and the first pixel may have a horizontally symmetrical structure, and the fourth pixel and the second pixel may have a horizontally symmetrical structure.

According to another aspect of the present disclosure, an organic light emitting display device comprises subpixel groups including a plurality of subpixels, and the subpixel groups being repeatedly arranged. In this instance, each of the subpixel groups includes a first subpixel unit and a second subpixel unit, each of the first subpixel unit and the second subpixel unit includes a single blue subpixel, two red subpixels, and two green subpixels, the two red subpixels of the first subpixel unit and the two green subpixels of the first subpixel unit are point-symmetrical with respect to a center of the blue subpixel of the first subpixel unit, respectively, and the two red subpixels of the second subpixel unit and the two green subpixels of the second subpixel unit are asymmetrical with respect to a center of the blue subpixel of the second subpixel unit, respectively. In the organic light emitting display device according to another example embodiment of the present disclosure, the subpixels included in a single repeating unit are asymmetrical to each other and a period where the subpixels are repeated is large, and as a result, it is possible to improve a cognitive fill factor, and minimize a lattice defect and color fringe.

According to one or more embodiments of the present disclosure, the organic light emitting display device may further comprise a first extended line runs through the centers of the two red subpixels of the first subpixel unit, a second extended line runs through the centers of the two green subpixels of the first subpixel unit, a third extended line runs through the centers of the two red subpixels of the second subpixel unit, and a fourth extended line runs through the centers of the two green subpixels of the second subpixel unit. The first extended line and the second extended line may run through the center of the blue subpixel of the first subpixel unit, and the third extended line and the fourth extended line may not run through the center of the blue subpixel of the second subpixel unit.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device comprising:
    a plurality of pixels including a first pixel and a second pixel being adjacent to the first pixel,
    wherein each of the plurality of pixels includes a plurality of subpixels,
    wherein the first pixel and the second pixel share at least one subpixel of the plurality of subpixels,
    wherein non-shared subpixels of the plurality of subpixels of the first pixel and the second pixel are symmetric relative to a center of the at least one subpixel that is shared,
    wherein the at least one subpixel shared by the first and second pixels includes a blue subpixel among the plurality of subpixels,
    wherein the non-shared subpixels of the plurality of subpixels of the first pixel and the second pixel are equidistance from the center of the at least one subpixel that is shared,
    wherein non-shared subpixels of a first color of the plurality of subpixels are aligned along a first direction, and non-shared subpixels of a second color of the plurality of subpixels are aligned along a second direction that intersects the first direction at intersections,
    wherein at least two non-shared subpixels of the first color of the plurality of subpixels are aligned along the first direction between adjacent intersections, and wherein the first and second directions are diagonal directions.

2. The organic light emitting display device of claim 1, wherein the plurality of subpixels include a green subpixel, a red subpixel, and the blue subpixel.

3. The organic light emitting display device of claim 2, wherein the first pixel and the second pixel are vertically adjacent to each other.

4. The organic light emitting display device of claim 2, wherein the blue subpixel is equally shared by the first pixel and the second pixel.

5. The organic light emitting display device of claim 2, wherein the blue subpixel is the same as or larger than each of the green subpixel and the red subpixel.

6. The organic light emitting display device of claim 1, wherein an area of an emission region of the at least one subpixel that is shared is the same as or larger than areas of emission regions of the non-shared subpixels of the plurality of subpixels.

7. The organic light emitting display device of claim 6, wherein the emission regions of the plurality of subpixels have one of a diamond shape, a round shape, and a rectangular shape.

8. The organic light emitting display device of claim 6, wherein the at least one shared subpixel has one anode electrode.

9. The organic light emitting display device of claim 6, wherein the at least one subpixel that is shared is disposed between the non-shared subpixels of the plurality of subpixels in the first and second pixels.

10. The organic light emitting display device of claim 6, wherein the non-shared subpixels of the plurality of subpixels of the first pixel and the second pixel are aligned in a vertical direction.

11. The organic light emitting display device of claim 1, wherein the first pixel and the second pixel are adjacent to each other in a column direction, and the first pixel and the second pixel are vertically asymmetrical.

12. The organic light emitting display device of claim 1, wherein each subpixel of the first pixel and the second pixel are point-symmetrical with respect to a center of the at least one subpixel shared by the first pixel and the second pixel.

13. The organic light emitting display device of claim 1, wherein the first pixel and the second pixel constitute a repeating pixel unit, and a plurality of repeating pixel units are continuously arranged in a column direction and continuously arranged in a row direction by being shifted by a predetermined distance in the column direction.

14. The organic light emitting display device of claim 13, wherein the plurality of repeating pixel units are repeatedly arranged every two periods in the row direction.

15. The organic light emitting display device of claim 13, wherein subpixels of the plurality of subpixels which are shared by first pixels and second pixels in the plurality of repeating pixel units are arranged in a zigzag pattern in the row direction.

16. The organic light emitting display device of claim 13, wherein the plurality of repeating pixel units arranged in a first column and the plurality of repeating pixel units arranged in a second column adjacent to the first column are horizontally symmetrical to each other.

17. The organic light emitting display device of claim 1, further comprising:
a first repeating pixel unit having a third pixel adjacent to the first pixel in a row direction, and a fourth pixel adjacent to the second pixel in the row direction and adjacent to the third pixel in a column direction,
wherein the third pixel and the first pixel have a symmetrical structure in the row direction, and the fourth pixel and the second pixel have a symmetrical structure in the row direction.

18. The organic light emitting display device of claim 1, wherein the first color is red, and the second color is green, and
wherein the at least one subpixel that is shared is enclosed by four non-shared subpixels of the first color of the plurality of subpixels aligned along the first direction, and four non-shared subpixels of the second color of the plurality of subpixels aligned along the second direction that are closest to the at least one subpixel that is shared.

19. An organic light emitting display device comprising:
a plurality of pixels including a first pixel and a second pixel, each of the plurality of pixels including a plurality of subpixels,
wherein the first pixel shares at least one of the plurality of subpixels with a first adjacent pixel, and the second pixel shares at least one of the plurality of subpixels with a second adjacent pixel,
wherein the first pixel and the second pixel are adjacent to each other in a column direction, and non-shared subpixels of the plurality of subpixels in each of the first pixel and the second pixel are arranged to be asymmetrical in the column direction,
wherein the non-shared subpixels of the plurality of subpixels in the first pixel are equidistance from a center of the at least one of the plurality of subpixels that is shared with the first adjacent pixel, and the non-shared subpixels of the plurality of subpixels in the second pixel are equidistance from a center of the at least one of the plurality of subpixels that is shared with the second adjacent pixel,
wherein non-shared subpixels of a first color of the plurality of subpixels are aligned along a first direction, and non-shared subpixels of a second color of the plurality of subpixels are aligned along a second direction that intersects the first direction at intersections,
wherein at least two non-shared subpixels of the first color of the plurality of subpixels are aligned along the first direction between adjacent intersections, and
wherein the first and second directions are diagonal directions.

20. The organic light emitting display device of claim 19, wherein the plurality of subpixels include a green subpixel, a red subpixel, and a blue subpixel, and
wherein the at least one shared subpixel includes the blue subpixel.

21. The organic light emitting display device of claim 20, wherein the first pixel and the second pixel are vertically adjacent to each other.

22. The organic light emitting display device of claim 19, wherein an area of an emission region of the at least one subpixel that is shared is the same as or larger than areas of emission regions of the non-shared subpixels of the plurality of subpixels in each of the first pixel and the second pixel.

23. The organic light emitting display device of claim 22, wherein the emission regions of the plurality of subpixels have one of a diamond shape, a round shape, and a rectangular shape.

24. The organic light emitting display device of claim 22, wherein the at least one shared subpixel has one anode electrode.

25. The organic light emitting display device of claim 22, wherein the at least one subpixel that is shared is disposed between the non-shared subpixels of the plurality of subpixels in the plurality of pixels.

26. The organic light emitting display device of claim 22, wherein the non-shared subpixels of the plurality of subpixels of the first pixel and the second pixel are aligned in a vertical direction.

27. The organic light emitting display device of claim 22, wherein the non-shared subpixels of the plurality of subpixels of the first pixel and the second pixel are symmetric relative to a center of the at least one subpixel that is shared.

28. The organic light emitting display device of claim 19, wherein the plurality of subpixels include a first subpixel, a second subpixel, and a third subpixel, and
wherein the first subpixel of the first pixel and the second subpixel of the second pixel are arranged in the same extended line in the column direction, and the second subpixel of the first pixel and the first subpixel of the second pixel are arranged in the same extended line in the column direction.

29. The organic light emitting display device of claim 19, wherein:
the first pixel and the second pixel adjacent to the first pixel in the column direction constitute a first repeating pixel unit; and
the plurality of pixels further comprise a third pixel and a fourth pixel, and the third pixel and the fourth pixel adjacent to the third pixel in the column direction constitute a second repeating pixel unit,
wherein the first repeating pixel unit and the second repeating pixel unit are adjacent to each other in a row direction, the third pixel is substantially identical to the first pixel in structure, and the fourth pixel is substantially identical to the second pixel in structure.

30. The organic light emitting display device of claim 19, wherein:
the first pixel and the second pixel adjacent to the first pixel in the column direction constitute a first repeating pixel unit; and
the plurality of pixels further comprise a third pixel and a fourth pixel, and the third pixel and the fourth pixel adjacent to the third pixel in the column direction constitute a second repeating pixel unit,
wherein the first repeating pixel unit and the second repeating pixel unit are adjacent to each other in a row direction, the third pixel and the first pixel have a horizontally symmetrical structure, and the fourth pixel and the second pixel have a horizontally symmetrical structure.

31. The organic light emitting display device of claim 19, wherein the first color is red, and the second color is green, and
wherein the at least one subpixel that is shared is enclosed by four non-shared subpixels of the first color of the plurality of subpixels aligned along the first direction, and four non-shared subpixels of the second color of the plurality of subpixels aligned along the second direction that are closest to the at least one subpixel that is shared.

* * * * *